(12) United States Patent
Heckmann et al.

(10) Patent No.: US 11,011,168 B2
(45) Date of Patent: May 18, 2021

(54) COMPACT SPEAKER DEVICE

(71) Applicant: GOOGLE LLC, Mountain View, CA (US)

(72) Inventors: Frédéric Heckmann, Zhubei (TW);
Yau-Shing Lee, Sunnyvale, CA (US);
Robert Rose, Mountain View, CA (US); Jun Hou, Shanghai (CN);
Patanjali Peri, Fremont, CA (US);
Phanindraja Ancha, San Francisco, CA (US)

(73) Assignee: Google LLC, Mountain View, CA (US)

( * ) Notice: Subject to any disclaimer, the term of this patent is extended or adjusted under 35 U.S.C. 154(b) by 43 days.

(21) Appl. No.: 16/285,061

(22) Filed: Feb. 25, 2019

(65) Prior Publication Data
US 2019/0259385 A1     Aug. 22, 2019

Related U.S. Application Data

(63) Continuation of application No. 15/840,844, filed on Dec. 13, 2017, now Pat. No. 10,290,302.
(Continued)

(51) Int. Cl.
*H04R 1/02*       (2006.01)
*G10L 15/22*      (2006.01)
(Continued)

(52) U.S. Cl.
CPC ............... *G10L 15/22* (2013.01); *G06F 1/20* (2013.01); *G06F 1/203* (2013.01); *H04M 1/035* (2013.01);
(Continued)

(58) Field of Classification Search
None
See application file for complete search history.

(56) References Cited

U.S. PATENT DOCUMENTS 6,327,144 B1   12/2001   May
7,092,745 B1    8/2006   D'Souza
(Continued)

FOREIGN PATENT DOCUMENTS

CN      103139673       6/2013
EP        3068202       9/2016
(Continued)

OTHER PUBLICATIONS

"Google Home Mini Review: Chasing Dots." The Verge, edited by Dan Seifert, Oct. 11, 2017, www.theverge.com/2017/10/11/16453788/google-home-mini-smart-speaker-review. (Year: 2017).*
(Continued)

*Primary Examiner* — James K Mooney
(74) *Attorney, Agent, or Firm* — Colby Nipper

(57) ABSTRACT

This application is directed to a speaker device having a rounded enclosure. The rounded enclosure includes two housing elements that are coupled to each other and have a substantially continuous transition. The rounded enclosure has a circular cross section defined by a first radius. A first housing element includes and extends past the circular cross section, and a second housing element has a second maximum radius that is smaller than the first radius. A speaker unit and a circuit board are arranged within the rounded enclosure. The circuit board is electrically coupled to the speaker unit. At least a portion of the first housing element includes perforations configured to enable transmission of sound generated by the speaker unit out of the speaker device. The second housing element has a power connector that is electrically coupled to the circuit board and is configured to receive power from an external power supply.

20 Claims, 9 Drawing Sheets

Related U.S. Application Data

(60) Provisional application No. 62/441,144, filed on Dec. 30, 2016.

(51) Int. Cl.

| | | |
|---|---|---|
| *G06F 1/20* | (2006.01) | |
| *H04M 1/03* | (2006.01) | |
| *H04R 1/34* | (2006.01) | |
| *H04R 9/02* | (2006.01) | |
| *H05K 7/20* | (2006.01) | |
| *H04M 1/60* | (2006.01) | |
| *H04R 27/00* | (2006.01) | |
| *G10K 11/26* | (2006.01) | |
| *H05K 1/02* | (2006.01) | |

(52) U.S. Cl.
CPC ............ *H04R 1/345* (2013.01); *H04R 9/022* (2013.01); *H05K 7/20009* (2013.01); *G10K 11/26* (2013.01); *G10L 2015/221* (2013.01); *H04M 1/6033* (2013.01); *H04R 27/00* (2013.01); *H04R 2227/003* (2013.01); *H04R 2227/005* (2013.01); *H04R 2430/01* (2013.01); *H04R 2499/11* (2013.01); *H05K 1/02* (2013.01)

(56) References Cited

U.S. PATENT DOCUMENTS

| | | | | |
|---|---|---|---|---|
| D596,159 S | * | 7/2009 | Yamaji | D14/209.1 |
| D676,423 S | * | 2/2013 | Joseph | D14/216 |
| D778,871 S | * | 2/2017 | Corval | D14/204 |
| 9,712,902 B1 | * | 7/2017 | Uziel | H04R 1/023 |
| D797,704 S | * | 9/2017 | Fischer | D14/216 |
| D828,330 S | * | 9/2018 | Nylen | D14/216 |
| 2005/0233781 A1 | | 10/2005 | Erixon et al. | |
| 2008/0087329 A1 | | 4/2008 | Chin et al. | |
| 2009/0196016 A1 | | 8/2009 | Massara et al. | |
| 2011/0317846 A1 | | 12/2011 | Yuan et al. | |
| 2012/0039491 A1 | | 2/2012 | Katz | |
| 2013/0028457 A1 | * | 1/2013 | Yeh | H04R 1/10 381/334 |
| 2014/0278435 A1 | | 9/2014 | Ganong, III et al. | |
| 2016/0255437 A1 | | 9/2016 | Wen et al. | |
| 2017/0208379 A1 | | 7/2017 | Uziel et al. | |

FOREIGN PATENT DOCUMENTS

| | | |
|---|---|---|
| GB | 2 504 723 | 2/2014 |
| JP | 3-211796 | 9/1991 |
| JP | 2016524410 | 8/2016 |
| JP | 2018525653 | 9/2018 |
| WO | WO 2016/045120 A1 | 3/2016 |

OTHER PUBLICATIONS

"JBL Clip2 Quick Start Guide.", Harman, May 2016. (Year: 2016).*
"iHome iDM8 portable rechargeable Bluetooth speaker instruction manual." SDI Technologies, 2012 (Year: 2012).*
"Look inside of JBL Clip2—Teardown." YouTube, MegaSafetyFirst, Dec. 24, 2016, www.youtube.com/watch?v=sB0Uns3GBhl&feature=emb_logo. (Year: 2016).*
Google LLC, International Search Report/Written Opinion, PCT/US2017/066975, dated Mar. 15, 2018, 10 pgs.
Parsons, Jeff. "New Manta X7 smartphone has no physical buttons." techradar, Dec. 4, 2014, 2 pgs.
"Foreign Office Action—Needs Translation", Japanese Application No. 2019535845, dated Apr. 6, 2021, 8 pages.
"Two waterproof Bluetooth speakers that pursue the JBL sound will be released in sequence", Harman International Industries, Incorporated, Press Release [online], Jun. 2, 2016 [Search date: Mar. 22, 2021], Internet [URL: https://prtimes.jp/a/?c=12767&r=57&f=d12767-57-pdf-0.pdf]., 5 pages.

* cited by examiner

COMPACT SPEAKER DEVICE

RELATED APPLICATIONS

This application is a continuation of and claims priority to U.S. Ser. No. 15/840,844, titled "Design for Compact Home Assistant with Combined Acoustic Waveguide and Heat Sink," filed on Dec. 13, 2017, which claims priority to U.S. Provisional Patent Application No. 62/441,144, titled "Design for Compact Home Assistant with Combined Acoustic Waveguide and Heat Sink," filed on Dec. 30, 2016, all of which are incorporated by reference herein in their entirety.

TECHNICAL FIELD

This application relates generally to computer technology, including but not limited to methods and systems for providing a voice activated electronic device that is used as a user interface in a smart home or media environment.

BACKGROUND

Electronic devices integrated with microphones have been widely used to collect voice inputs from users and implement different voice-activated functions according to the voice inputs. For example, many state-of-the-art mobile devices include a voice assistant system (e.g., Siri and Google Assistant) that is configured to use voice inputs to initiate a phone call, conduct a restaurant search, start routing on a map, create calendar events, add a post to a social network, recognize a song and complete many other tasks. The mobile devices often include display screens that allow users who provide the voice inputs to check the status of the tasks requested via the voice inputs.

However, in many operating environments it is more desirable/convenient (or even necessary) for a user to receive audible responses to their voice inputs instead of visual information shown on a display. This can be the case when an electronic device that is providing user assistance does not have a display screen (as is the case with the Google Home voice-activated speaker, which is powered by the Google Assistant) or when a user is not able to interact with a display screen (as is the case in many home environments, where a user is interacting with a voice-activated assistant device that is not nearby or where a user is focused on a particular task).

For such operating environments, it is helpful to provide an electronic device with a speaker system that generates sound of sufficient clarity and volume to provide effective audible responses to user requests for assistance. Such electronic devices also require onboard support electronics, such as one or more of: radio receivers, transmitters and antennas to support wireless communications; power circuitry and connectors; processors and support chips for on-device processing; and data connectors. Depending on the home/operating environment in which such electronic assistant devices are deployed, the assistant devices can also be designed with different appearances and/or form factors. In particular, where a compact form factor is desired, it presents a challenge to combine the above-recited components so as to effectively dissipate heat generated by the electronics while also providing sufficient air space for effective operation of the speaker system. This challenge is heightened when it is desired that the electronic device possess a relatively simple structure and can be made at a low cost, while implementing voice activated functions similar to those that can be performed by mobile devices.

Thus, there is a need for compact designs for electronic voice-assistant devices that provide effective audible output and heat dissipation.

SUMMARY

Electronic voice-activated devices are disclosed that provide in a small form factor voice assistant capabilities that enable users to perform a range of activities through natural language voice commands, including one or more of: controlling local and remote electronic devices, issuing requests for services and information to remote servers, and/or sending media information to other electronic devices for consumption by the user or other users. In some implementations electronic voice-activated devices include visual indicators, such as one or more full-color LEDs, that are used to indicate the status of voice processing associated with a spoken user request. In some implementations, electronic voice activated devices include one or more speakers that can be used to relay audible information to a user to provide an answer to a user request (such a search query or a request for a basketball score), provide a spoken status of a voice processing operation, play a musical selection, and/or read digest of current news or the current weather forecast. Given that voice inputs are convenient for users, some implementations allow a user to use voice inputs to control other electronic devices accessible to the user in addition to requesting Internet-based services and functions from remote servers and mobile devices.

Accordingly, implementations of electronic devices are described herein that provide an eyes-free and hands-free voice interface to enable users to activate voice-activated functions on associated media player devices, issue information requests to remote servers, consume audible information or media, and/or control smart home or smart media devices coupled within the voice-activated electronic devices in a smart media or smart home environment. In various implementations described herein, a smart media environment includes one or more voice-activated electronic devices and multiple media display devices each disposed at a distinct location. In some implementations, these devices are coupled to a cast device (e.g., a set top box, a Google Chromecast™ device or a smart TV). These devices can be directed via voice requests issued to a voice-activated device to play media items identified verbally by a user.

These network-connected and voice-activated electronic devices are normally placed on surfaces at different locations of the smart home environment. As such, in some implementations electronic voice assistant devices are configured to have a form factor and appearance that matches the overall smart home environment and/or can be integrated with multiple compatible surfaces and devices throughout the environment. For example, in some implementations a voice-activated electronic device includes a separable base that can be replaced to enable better matching to surface finishes in a variety of home environments. In some implementations, the separable bases are separable grills with a variety of surface appearances, such as cloth, leather, metallic, and smooth. In some implementations, the base is connected to an upper portion of an electronic device via magnetic attraction, which enables the base and upper portion of an electronic device to be fastened securely but separable using manual user manipulation. In some implementations, the base and the upper portion can be separated using a twisting motion followed by a separation motion and in some implementations the base and the upper portion can be separated using only a separation motion. In some implementations, the electronic device includes an upper portion that serves as a speaker grill that allows transmission of sound outside the device from one or more speakers contained within the electronic device. In some implementations, the upper portion/speaker grill can be configured with different surface finishes and/or can be securely but separably fastened to the base portion as described above.

In some implementations, the electronic device is a compact device that includes one or more speakers and a plurality of electronic components, including one or more of: microprocessors, memory, support chips, wireless receivers and transmitters, antennas, power supply circuitry, one or more cameras, power and/or data connectors, etc., some of which are mounted on one or more printed circuit boards. The speakers can be employed for any audio output purpose, including output of audible responses to user verbal inputs, playback of audio tracks of media content, and generation of audible alerts (including beeps, alarms, sirens, etc). In some implementations, the one or more speakers are mounted within the electronic device such that there is no direct path for transmission to the outside of the device of sound generated by the one or more speakers. In such implementations, in order to promote effective speaker operation (including effective transmission of sound output by the speaker to the outside of the device), a waveguide is provided within the electronic device to redirect sound output by the one or more speakers from the inside to the outside of the device. In some implementations, the waveguide is configured to redirect the sound to a speaker grill provided at an outer surface of the electronic device.

In some implementations, the waveguide is also configured to serve as a heatsink to dissipate to the outside of the electronic device heat generated by operation of the electronic components and is mounted in proximity to least some of the electronic components.

In some implementations, the one more speakers are mounted in a base portion of the electronic device and have a primary sound projection direction that faces upwards within the device, towards a curved portion of the dual purpose waveguide/heatsink. The curved portion is designed to redirect sound from the one or more speakers to the outside of the electronic device. Heat generating electronic components and/or one or more printed circuit boards carrying electronic components are attached directly to a second portion of the dual purpose waveguide/heatsink (or are coupled indirectly thereto using a thermal conduction path) so as to transmit to the heatsink heat generated by operation of the electronic components. The heatsink is configured to move to the outside of the electronic device heat transmitted thereto from the attached electronic components. In some implementations, the heatsink is made from materials that have highly effective thermal conduction properties to promote movement of heat from within the device to the outside of the device. In some implementations, the curved portion is a bottom surface of the dual purpose waveguide/heatsink (e.g., a surface facing downwards towards the one or more speakers) and the second portion is an upper surface of the dual purpose waveguide/heatsink that is opposite the bottom surface of the dual purpose waveguide/heatsink (e.g., a surface facing upwards to which the electronic components are attached). In some implementations, positions of the electronic components and the one more speakers are interchanged such that the one more speakers are located in an upper portion of the electronic device and project downwards towards a upper (curved) surface of the dual purpose waveguide/heatsink and the electronic components are mounted in a base portion of the electronic device and the waveguide/heatsink in the lower portion.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

Like reference numerals refer to corresponding parts throughout the several views of the drawings.

DESCRIPTION OF IMPLEMENTATIONS

Figure 1:
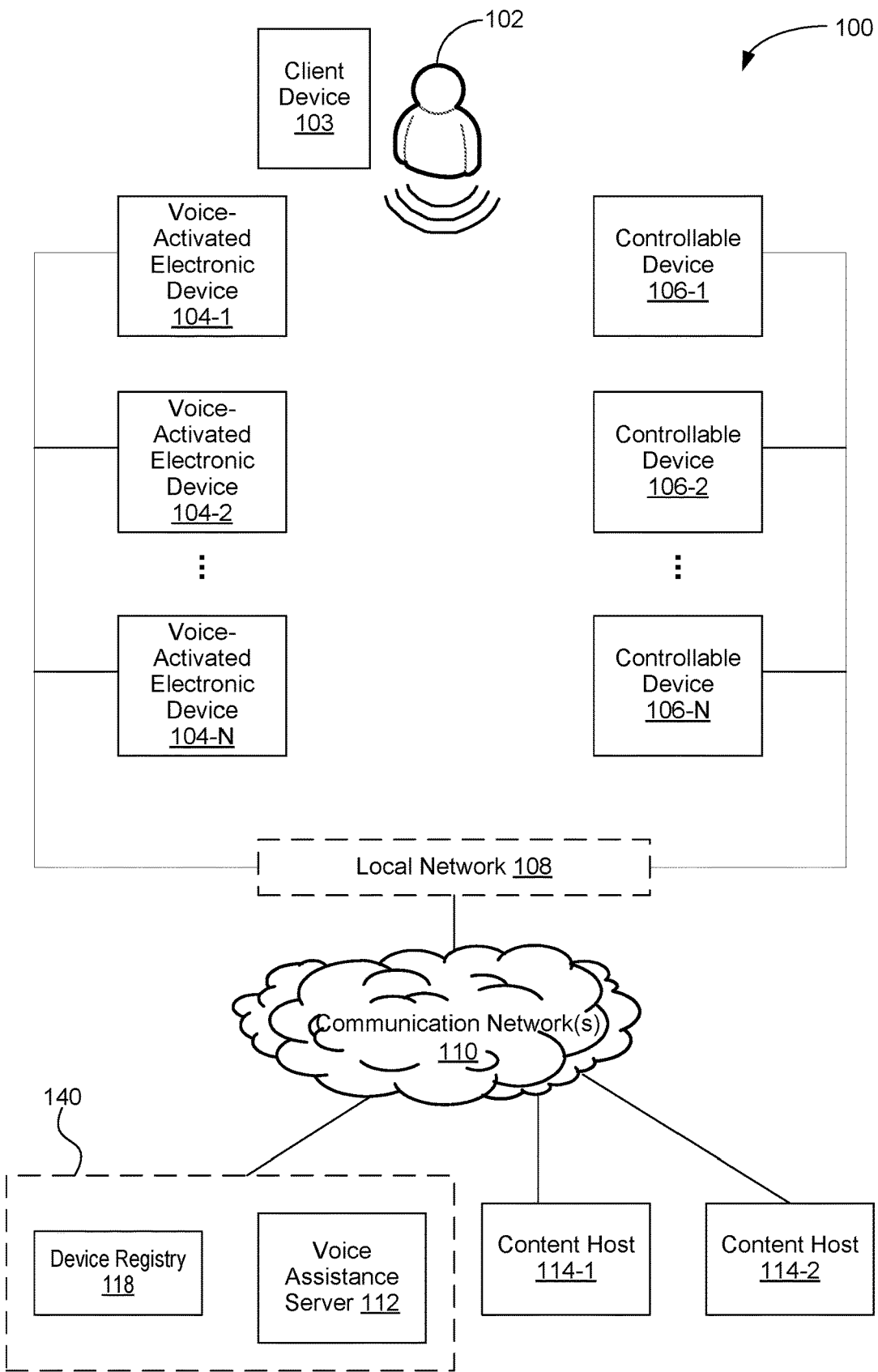
FIG. 1 illustrates an example operating environment in accordance with some implementations.

The digital revolution has provided many benefits ranging from enabling open sharing of information to a sense of global community. However, emerging new technologies often induce confusion, skepticism and fear among consumers, preventing consumers from benefitting from the technology. Electronic devices are conveniently used as voice interfaces to receive voice inputs from users and initiate voice-activated functions, and thereby offer eyes-free and hands-free solutions for enabling simple and productive user interaction with both existing and emerging technology. Specifically, the voice inputs received at an electronic device with voice activated features can carry instructions and information even if a user's line of sight is obscured and his or her hands are full. To enable a hands-free and eyes-free experience, a voice-activated electronic device in accordance with the present invention "listens" to the ambient (i.e., constantly processes audio signals collected from the ambient) constantly or only when triggered to do so (e.g., via user utterance of a "hot word" to trigger operation of the electronic device." On the other hand, user identities are linked with a user's voice and a language used by the user. To protect the user identities, these voice-activated electronic devices are normally used in non-public places that are protected, controlled and intimate spaces (e.g., home and car).

Specifically, in some implementations, an electronic device provides an eyes-free and hands-free voice interface to activate voice-activated functions on other media play devices or smart home devices coupled within a smart media or home environment. The smart media environment includes one or more voice-activated electronic devices and multiple media display devices each disposed at a distinct location. Some of the electronic devices are coupled to a cast device that can (e.g., a set top box). Each voice-activated electronic device is configured to record a voice message from which a cloud cast service server determines a user voice request (e.g., a media play request, a media transfer request or a closed caption initiation request). The cloud cast service server then directs the user voice request to a destination cast device as indicated by the voice message. Similar arrangement could be used to control smart home devices to implement voice-activated functions in a smart home environment. Such methods optionally complement or replace conventional methods of requiring a user to use a remote control or a client device to control the media devices or the smart home devices in a smart media or home environment.

In accordance with various implementations of this application, network-connected and voice-activated electronic devices are normally placed on surfaces at different locations of the smart home environment. Each voice-activated electronic device is configured to have a form factor that matches the overall smart home environment. For example, each voice-activated electronic device includes a base that could match and come into contact with different types of surfaces including a desktop, a furniture surface, a docking station, a media player device or other surfaces. Such a voice-activated electronic device is configured to couple to its base in a compact and robust manner, thereby merging into various home environments naturally.

In some implementations, the electronic device is a compact device that includes one or more speakers and a plurality of electronic components, including one or more of: microprocessors, memory, support chips, wireless receivers and transmitters, antennas, power supply circuitry, one or more cameras, power and/or data connectors, etc., some of which are mounted on one or more printed circuit boards. The speakers can be employed for any audio output purpose, including output of audible responses to user verbal inputs, playback of audio tracks of media content, and generation of audible alerts (including beeps, alarms, sirens, etc). In some implementations, the one or more speakers are mounted within the electronic device such that there is no direct path for transmission to the outside of the device of sound generated by the one or more speakers. In such implementations, in order to promote effective speaker operation (including effective transmission of sound output by the speaker to the outside of the device), a waveguide is provided within the electronic device to redirect sound output by the one or more speakers from the inside to the outside of the device. In some implementations, the waveguide is configured to redirect the sound to a speaker grill provided at an outer surface of the electronic device. In some implementations, the waveguide is also configured to serve as a heatsink to dissipate to the outside of the electronic device heat generated by operation of the electronic components and is mounted in proximity to least some of the electronic components.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Voice Assistant Operating Environment

FIG. 1 is an example operating environment in accordance with some implementations. Operating environment 100 includes one or more voice-activated electronic devices 104 (e.g., voice-activated electronic devices 104-1 thru 104-N, hereinafter "voice-activated device(s)"). The one or more voice-activated devices 104 may be located in one or more locations (e.g., all in a room or space of a structure, spread out throughout multiple spaces within a structure or throughout multiple structures (e.g., one in a house and one in the user's car)).

The environment 100 also includes one or more controllable electronic devices 106 (e.g., electronic device 106-1 thru 106-N, hereinafter "controllable device(s)"). Examples of controllable devices 106 include media devices (smart televisions, speaker systems, wireless speakers, set-top boxes, media streaming devices, cast devices), and smart home devices (e.g., smart camera, smart thermostat, smart light, smart hazard detector, smart door lock).

The voice-activated devices 104 and the controllable devices 106 are communicatively coupled, through communication networks 110, to a voice assistant service 140 (e.g., to a voice assistance server system 112 of the voice assistant service 140). In some implementations, one or more of the voice-activated devices 104 and the controllable devices 106 are communicatively coupled to a local network 108, which is communicatively coupled to the communication networks 110; the voice-activated device(s) 104 and/or the controllable device(s) 106 are communicatively coupled to communication network(s) 110 (and, through the communication networks 110, to the voice assistance server system 112) via the local network 108. In some implementations, the local network 108 is a local area network implemented at a network interface (e.g., a router). The voice-activated devices 104 and the controllable devices 106 that are communicatively coupled to the local network 108 may also communicate with each other through the local network 108.

Optionally, one or more of the voice-activated devices 104 are communicatively coupled to the communication networks 110 and are not on the local network 108. For example, these voice-activated devices are not on the Wi-Fi network corresponding to the local network 108 but are connected to the communication networks 110 through a cellular connection. In some implementations, communication between voice-activated devices 104 that are on the local network 108 and voice-activated devices 104 that are not on the local network 108 are done through the voice assistance server system 112. The voice-activated devices 104 (whether on the local network 108 or on the network 110) are registered in a device registry 118 of the voice assistant service 140 and thus known to the voice assistance server system 112. Similarly, the voice-activated devices 104 that are not on the local network 108 may communicate with controllable devices 106 through the voice assistant server system 112. The controllable devices 106 (whether on the local network 108 or on the network 110) are also registered in the device registry 118. In some implementations, communications between the voice-activated devices 104 and the controllable devices 106 go through the voice assistance server system 112.

In some implementations, the environment 100 also includes one or more content hosts 114. A content host 114 may be a remote content source from which content is streamed or otherwise obtained in accordance with a request included in a user voice input or command. A content host 114 may be an information source from which the voice assistance server system 112 retrieves information in accordance with a user voice request.

In some implementations, controllable devices 106 are capable of receiving commands or requests to perform specified operations or to transition to specified states (e.g., from a voice-activated device 104 and/or the voice assistance server system 112) and to perform the operations or transition states in accordance with the received commands or requests.

In some implementations, one or more of the controllable devices 106 are media devices that are disposed in the operating environment 100 to provide to one or more users media content, news and/or other information. In some implementations, the content provided by the media devices is stored at a local content source, streamed from a remote content source (e.g., content host(s) 114), or generated locally (e.g., through a local text to voice processor that reads a customized news briefing, emails, texts, a local weather report, etc. to one or more occupants of the operating environment 100). In some implementations, the media devices include media output devices that directly output the media content to an audience (e.g., one or more users), and cast devices that are networked to stream media content to the media output devices. Examples of the media output devices include, but are not limited to television (TV) display devices and music players. Examples of the cast devices include, but are not limited to, set-top boxes (STBs), DVD players, TV boxes, and media streaming devices, such as Google's Chromecast™ media streaming device.

In some implementations, a controllable device 106 is also a voice-activated device 104. In some implementations, a voice-activated device 104 is also a controllable device 106. For example, a controllable device 106 may include a voice interface to the voice assistance service 140 (e.g., a media device that can also receive, process, and respond to user voice inputs). As another example, a voice-activated device 104 may also perform particular operations and transition to particular states in accordance with requests or commands in voice inputs (e.g., a voice interface device that can also play streaming music).

In some implementations, the voice-activated devices 104 and the controllable deices 106 are associated with a user having a respective account, or with multiple users (e.g., a group of related users, such as users in a family or in an organization; more generally, a primary user and one or more authorized additional users) having respective user accounts, in a user domain. A user may make voice inputs or voice commands to the voice-activated device 104. The voice-activated device 104 receives these voice inputs from the user (e.g., user 102), and the voice-activated device 104 and/or the voice assistance server system 112 proceeds to determine a request in the voice input and generate a response to the request.

In some implementations, the request included in a voice input is a command or request to a controllable device 106 to perform an operation (e.g., play media, pause media, fast forward or rewind media, change volume, change screen brightness, change light brightness) or transition to another state (e.g., change the mode of operation, turn on or off, go into sleep mode or wake from sleep mode).

In some implementations, a voice-activated electronic device 104 responds to voice inputs by: generating and providing a spoken response to a voice command (e.g., speaking the current time in response to the question, "what time is it?"); streaming media content requested by a user (e.g., "play a Beach Boys song"); reading a news story or a daily news briefing prepared for the user; playing a media item stored on the personal assistant device or on the local network; changing a state or operating one or more other connected devices within the operating environment 100 (e.g., turning lights, appliances or media devices on/off, locking/unlocking a lock, opening windows, etc.); or issuing a corresponding request to a server via a network 110.

In some implementations, the one or more voice-activated devices 104 are disposed in the operating environment 100 to collect audio inputs for initiating various functions (e.g., media play functions of the media devices). In some implementations, these voice-activated devices 104 (e.g., devices 104-1 thru 104-N) are disposed in proximity to a controllable device 104 (e.g., a media device), for example, in the same room with the cast devices and the media output devices. Alternatively, in some implementations, a voice-activated device 104 is disposed in a structure having one or more smart home devices but not any media device. Alternatively, in some implementations, a voice-activated device 104 is disposed in a structure having one or more smart home devices and one or more media devices. Alternatively, in some implementations, a voice-activated device 104 is disposed in a location having no networked electronic device. Further, in some implementations, a room or space in the structure may have multiple voice-activated devices 104.

In some implementations, the voice-activated device 104 includes at least one or more microphones, a speaker, a processor and memory storing at least one program for execution by the processor. The speaker is configured to allow the voice-activated device 104 to deliver voice messages and other audio (e.g., audible tones) to a location where the voice-activated device 104 is located in the operating environment 100, thereby broadcasting music, reporting a state of audio input processing, having a conversation with or giving instructions to a user of the voice-activated device 104. As an alternative to the voice messages, visual signals could also be used to provide feedback to the user of the voice-activated device 104 concerning the state of audio input processing. When the voice-activated device 104 is a mobile device (e.g., a mobile phone or a tablet computer), its display screen is configured to display a notification concerning the state of audio input processing.

In some implementations, the voice-activated device 104 is a voice interface device that is network-connected to provide voice recognition functions with the aid of a voice assistance server system 112. For example, the voice-activated device 104 includes a smart speaker that provides music to a user and allows eyes-free and hands-free access to a voice assistant service (e.g., Google Assistant). Optionally, the voice-activated device 104 is one of a desktop or laptop computer, a tablet, a mobile phone that includes a microphone, a cast device that includes a microphone and optionally a speaker, an audio system (e.g., a stereo system, a speaker system, a portable speaker) that includes a microphone and a speaker, a television that includes a microphone and a speaker, and a user interface system in an automobile that includes a microphone and a speaker and optionally a display. Optionally, the voice-activated device 104 is a simple and low cost voice interface device. Generally, the voice-activated device 104 may be any device that is capable of network connection and that includes a microphone, a speaker, and programs, modules, and data for interacting with voice assistant service. Given simplicity and low cost of the voice-activated device 104, the voice-activated device 104 includes an array of light emitting diodes (LEDs) rather than a full display screen, and displays a visual pattern on the LEDs to indicate the state of audio input processing. In some implementations, the LEDs are full color LEDs, and the colors of the LEDs may be employed as a part of the visual pattern to be displayed on the LEDs. Multiple examples of using LEDs to display visual patterns in order to convey information or device status are described in U.S. Provisional Patent Application No. 62/336,566, entitled "LED Design Language for Visual Affordance of Voice User Interfaces," filed May 13, 2016, which is incorporated by reference in its entirety. In some implementations, visual patterns indicating the state of voice processing operations are displayed using characteristic images shown on conventional displays associated with voice-activated devices that are performing the voice processing operations.

Figure 4A:
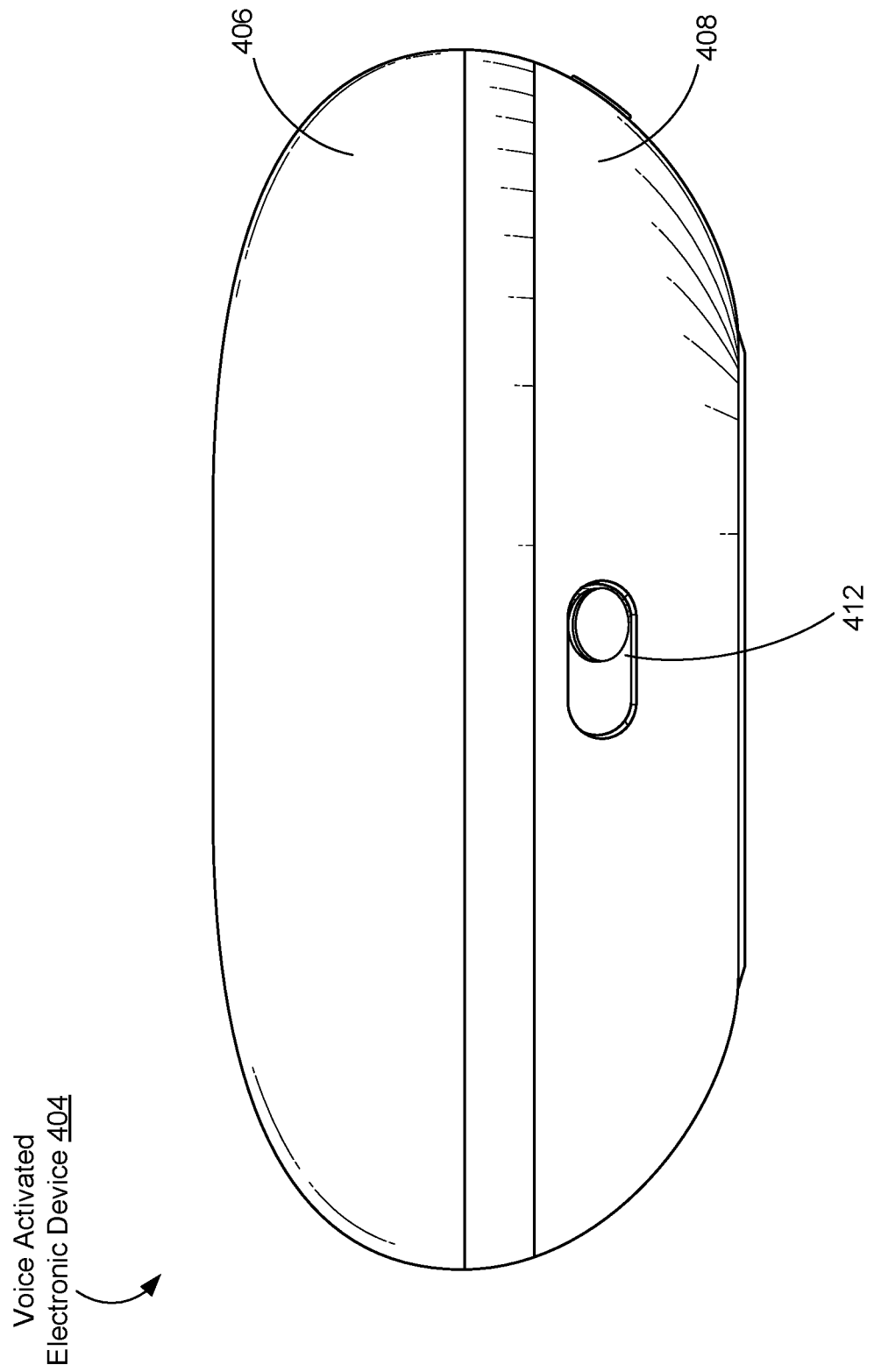
FIGS. 4A, 4B and 4C are a front view, a side view and a rear view respectively of an example voice-activated electronic device in accordance with some implementations.

In some implementations, LEDs or other visual displays are used to convey a collective voice processing state of multiple participating electronic devices. For example, in an operating environment where there are multiple voice processing or voice interface devices (e.g., multiple electronic devices 400 as shown in FIG. 4A of the '566 application; multiple voice-activated devices 104), groups of color LEDs (e.g., LEDs 404 as shown in FIG. 4A of the '566 application) associated with respective electronic devices can be used to convey which of the electronic devices is listening to a user, and which of the listening devices is the leader (where the "leader" device generally takes the lead in responding to a spoken request issued by the user).

More generally, the '566 application describes (e.g., see paras. [0087]-[0100]) a "LED Design Language" for indicating visually using a collection of LEDs a variety of voice processing states of an electronic device, such as a "Hot word detection state and listening state," a "Thinking mode or working mode," and a "Responding mode or speaking mode." In some implementations, unique states of voice processing operations described herein are represented using a group of LEDs in accordance with one or more aspects of the "LED Design Language" of the '566 application. These visual indicators can also be combined with one or more audible indicators generated by electronic devices that are performing voice processing operations. The resulting audio and/or visual indicators will enable users in a voice-interactive environment to understand the state of various voice processing electronic devices in the environment and to effectively interact with those devices in a natural, intuitive manner.

In some implementations, when voice inputs to the voice-activated device 104 are used to control the media output devices via the cast devices, the voice-activated device 104 effectively enables a new level of control of cast-enabled media devices. In a specific example, the voice-activated device 104 includes a casual enjoyment speaker with far-field voice access and functions as a voice interface device for the voice assistant service. The voice-activated device 104 could be disposed in any area in the operating environment 100. When multiple voice-activated devices 104 are distributed in multiple rooms, they become cast audio receivers that are synchronized to provide voice inputs from these rooms.

Specifically, in some implementations, the voice-activated device 104 includes a Wi-Fi speaker with a microphone that is connected to a voice-activated voice assistant service (e.g., Google Assistant). A user can issue a media play request via the microphone of voice-activated device 104, and ask the voice assistant service to play media content on the voice-activated device 104 itself or on another connected media output device. For example, the user can issue a media play request by saying to the Wi-Fi speaker "OK Google, play cat videos on my Living room TV." The voice assistant service then fulfils the media play request by playing the requested media content on the requested device using a default or designated media application.

In some implementations, a user can issue a voice request, via the microphone of the voice-activated device 104, concerning media content that has already been played or is being played on a display device (e.g., the user can ask for information about the media content, buy the media content through an online store, or compose and issue a social post about the media content).

In some implementations, a user may want to take a current media session with them as they move through the house and can request such a service from one or more of the voice-activated devices 104. This requires the voice assistant service 140 to transfer the current media session from a first cast device to a second cast device that is not directly connected to the first cast device or has no knowledge of the existence of the first cast device. Subsequent to the media content transfer, a second output device coupled to the second cast device continues to play the media content previously a first output device coupled to the first cast device from the exact point within a music track or a video clip where play of the media content was forgone on the first output device. In some implementations, the voice-activated device 104 that receives the request to transfer the media session can satisfy the request. In some implementations, the voice-activated device 104 that receives the request to transfer the media session relays the request to another device or system (e.g., voice assistance server system 112) for handling.

Further, in some implementations, a user may issue, via the microphone of voice-activated device 104, a request for information or for performance of an action or operation. The information requested may be personal (e.g., the user's emails, the user's calendar events, the user's flight information, etc.), non-personal (e.g., sports scores, news stories, etc.) or somewhere in between (e.g., scores for teams or sports preferred by the user, news stories from the user's preferred sources, etc.). The requested information or action/operation may involve access to personal information (e.g., purchasing a digital media item with payment information provided by the user, purchasing a physical good). The voice-activated device 104 responds to the request with voice message responses to the user, where the response may include, for example, requests for additional information to fulfill the request, confirmation that the request has been fulfilled, notice that the request cannot be fulfilled, and so forth.

In some implementations, in addition to the voice-activated devices 104 and the media devices amongst the controllable devices 106, the operating environment 100 may also include one or more smart home devices amongst the controllable devices 106. The integrated smart home devices include intelligent, multi-sensing, network-connected devices that integrate seamlessly with each other in a smart home network and/or with a central server or a cloud-computing system to provide a variety of useful smart home functions. In some implementations, a smart home device is disposed at the same location of the operating environment 100 as a cast device and/or an output device, and therefore, is located in proximity to or with a known distance with respect to the cast device and the output device.

The smart home devices in the operating environment 100 may include, but are not limited to, one or more intelligent, multi-sensing, network-connected thermostats, one or more intelligent, network-connected, multi-sensing hazard detectors, one or more intelligent, multi-sensing, network-connected entryway interface devices and (hereinafter referred to as "smart doorbells" and "smart door locks"), one or more intelligent, multi-sensing, network-connected alarm systems, one or more intelligent, multi-sensing, network-connected camera systems, one or more intelligent, multi-sensing, network-connected wall switches, one or more intelligent, multi-sensing, network-connected power sockets, and one or more intelligent, multi-sensing, network-connected lights. In some implementations, the smart home devices in the operating environment 100 of FIG. 1 includes a plurality of intelligent, multi-sensing, network-connected appliances (hereinafter referred to as "smart appliances"), such as refrigerators, stoves, ovens, televisions, washers, dryers, lights, stereos, intercom systems, garage-door openers, floor fans, ceiling fans, wall air conditioners, pool heaters, irrigation systems, security systems, space heaters, window AC units, motorized duct vents, and so forth. In some implementations, any one of these smart home device types can be outfitted with microphones and one or more voice processing capabilities as described herein so as to in whole or in part respond to voice requests from an occupant or user.

In some implementations, each of the controllable devices 104 and the voice-activated devices 104 is capable of data communications and information sharing with other controllable devices 106, voice-activated electronic devices 104, a central server or cloud-computing system, and/or other devices (e.g., a client device) that are network-connected. Data communications may be carried out using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

Through the communication networks (e.g., the Internet) 110, the controllable devices 106 and the voice-activated devices 104 may communicate with a server system (also called a central server system and/or a cloud-computing system herein). Optionally, the server system may be associated with a manufacturer, support entity, or service provider associated with the controllable devices and the media content displayed to the user. Accordingly, the server system includes the voice assistance server 112 that processes audio inputs collected by voice-activated devices 104, one or more content hosts 114 that provide the displayed media content, optionally a cloud cast service server creating a virtual user domain based on distributed device terminals, and the device registry 118 that keeps a record of the distributed device terminals in the virtual user environment. Examples of the distributed device terminals include, but are not limited to the controllable devices 106, the voice-activated devices 104, and the media output devices. In some implementations, these distributed device terminals are linked to a user account (e.g., a Google user account) in the virtual user domain. It should be appreciated that processing of audio inputs collected by voice-activated devices 104 can be performed locally at a voice-activated device 104, at a voice assistance server 112, at another smart home device (e.g., a hub device) or at some combination of all or subset of the above.

It will be appreciated that in some implementations the voice-activated device(s) 104 also function in an environment without smart home devices. For example, a voice-activated device 104 can, even in the absence of smart home devices, respond to user requests for information or performance of an action, and/or to initiate or control various media play functions. A voice-activated device 104 can also function in a wide range of environments, including, without limitation, a vehicle, a ship, a business, or a manufacturing environment.

In some implementations, a voice-activated device 104 is "awakened" (e.g., to activate an interface for the voice assistant service on the voice-activated device 104, to put the voice-activated device 104 into a state where the voice-activated device 104 is ready to receive voice requests to the voice assistant service) by a voice input that includes a hotword (also called a "wake word"). In some implementations, the voice-activated device 104 requires awakening if the voice-activated device 104 has been idle with respect to receipt of voice inputs for at least a predefined amount of time (e.g., 5 minutes); the predefined amount of time corresponds to an amount of idle time allowed before a voice interface session or conversation times out. The hotword may be a word or phrase, and may be a predefined default and/or may be customized by a user (e.g., a user may set a nickname for a particular voice-activated device 104 as the device's hotword). In some implementations, there may be multiple hotwords that can awaken a voice-activated device 104. A user may speak the hotword, wait for an acknowledgement response from the voice-activated device 104 (e.g., the voice-activated device 104 outputs a greeting), and them make a first voice request. Alternatively, the user may combine the hotword and the first voice request in one voice input (e.g., the voice input includes the hotword followed by the voice request).

In some implementations, a voice-activated device 104 interacts with a controllable device 106 (e.g., a media device, a smart home device), a client device or a server system of an operating environment 100 in accordance with some implementations. The voice-activated device 104 is configured to receive audio inputs from an environment in proximity to the voice-activated device 104. Optionally, the voice-activated device 104 stores the audio inputs and at least partially processes the audio inputs locally. Optionally, the voice-activated device 104 transmits the received audio inputs or the partially processed audio inputs to a voice assistance server system 112 via the communication networks 110 for further processing. The voice-activated device 104 or the voice assistance server system 112 determines if there is a request in the audio input and what the request is, determines and generates a response to the request, and transmits the request to one or more controllable device(s) 106. The controllable device(s) 106 receiving the response is configured to perform operations or change states in accordance with the response. For example, a media device is configured to obtain media content or Internet content from one or more content hosts 114 for display on an output device coupled to the media device, in accordance with a response to a request in the audio input.

In some implementations, the controllable device(s) 106 and the voice-activated device(s) 104 are linked to each other in a user domain, and more specifically, associated with each other via a user account in the user domain. Information on the controllable device 106 (whether on the local network 108 or on the network 110) and the voice-activated device 104 (whether on the local network 108 or on the network 110) are stored in the device registry 118 in association with the user account. In some implementations, there is a device registry for controllable devices 106 and a device registry for voice-activated devices 104. The controllable devices registry may reference devices in the voice-activated devices registry that are associated in the user domain, and vice versa.

In some implementations, one or more of the voice-activated devices 104 (and one or more cast devices) and one or more of the controllable devices 106 are commissioned to the voice assistant service 140 via a client device 103. In some implementations, the voice-activated device 104 does not include any display screen, and relies on the client device 103 to provide a user interface during a commissioning process, and similarly for a controllable device 106 as well. Specifically, the client device 103 is installed with an application that enables a user interface to facilitate commissioning of a new voice-activated device 104 and/or a controllable device 106 disposed in proximity to the client device. A user may send a request on the user interface of the client device 103 to initiate a commissioning process for the new electronic device 104/106 that needs to be commissioned. After receiving the commissioning request, the client device 103 establishes a short range communication link with the new electronic device 104/103 that needs to be commissioned. Optionally, the short range communication link is established based near field communication (NFC), Bluetooth, Bluetooth Low Energy (BLE) and the like. The client device 103 then conveys wireless configuration data associated with a wireless local area network (WLAN) (e.g., local network 108) to the new or electronic device 104/106. The wireless configuration data includes at least a WLAN security code (i.e., service set identifier (SSID) password), and optionally includes a SSID, an Internet protocol (IP) address, proxy configuration and gateway configuration. After receiving the wireless configuration data via the short range communication link, the new electronic device 104/106 decodes and recovers the wireless configuration data, and joins the WLAN based on the wireless configuration data.

In some implementations, additional user domain information is entered on the user interface displayed on the client device 103, and used to link the new electronic device 104/106 to an account in a user domain. Optionally, the additional user domain information is conveyed to the new electronic device 104/106 in conjunction with the wireless communication data via the short range communication link. Optionally, the additional user domain information is conveyed to the new electronic device 104/06 via the WLAN after the new device has joined the WLAN.

Once the electronic device 104/106 has been commissioned into the user domain, other devices and their associated activities may be controlled via multiple control paths. In accordance with one control path, an application installed on the client device 103 is used to control the other device and its associated activities (e.g., media play activities). Alternatively, in accordance with another control path, the electronic device 104/106 is used to enable eyes-free and hands-free control of the other device and its associated activities.

In some implementations, voice-activated devices 104 and controllable devices 106 may be assigned nicknames by a user (e.g., by the primary user with whom the devices are associated in the user domain). For example, a speaker device in the living room may be assigned a nickname "living room speaker." In this way, the user may more easily refer to a device in a voice input by speaking the device's nickname. In some implementations, the device nicknames and mappings to corresponding devices are stored at a voice-activated device 104 (which would store the nicknames of just the devices associated with the same user as the voice-activated device) and/or the voice assistance server system 112 (which would store deice nicknames of devices associated with different users). For example, the voice assistance server system 112 stores many device nicknames and mappings across different devices and users, and voice-activated devices 104 associated with a particular user download nicknames and mappings for devices associated with the particular user for local storage.

In some implementations, a user may group one or more of the voice-activated devices 104 and/or controllable devices 106 into a group of devices created by the user. The group may be given a name, and the group of devices may be referred by the group name, similarly to referring to individual devices by nickname. Similarly to device nicknames, device groups and group names may be stored at a voice-activated device 104 and/or the voice assistance server system 112.

A voice input from the user may explicitly specify a target controllable device 106 or a target group of devices for the request in the voice input. For example, a user may utter a voice input "play classical music on the living room speaker." The target device in the voice input is "living room speaker"; the request in the voice input is a request to have the "living room speaker" play classical music. As another example, a user may utter a voice input "play classical music on the house speakers," where "house speakers" is a name of a group of devices. The target device group in the voice input is "house speakers"; the request in the voice input is a request to have the devices in the group "house speakers" play classical music.

A voice input from the user may not have an explicit specification of a target device or device group; a reference to a target device or device group by name is absent in the voice input. For example, following on the example voice input "play classical music on the living room speaker" above, the user may utter a subsequent voice input "pause." The voice input does not include a target device specification for the request for a pause operation. In some implementations, the target device specification in the voice input may be ambiguous. For example, the user may have uttered the device name incompletely. In some implementations, a target device or device group may be assigned to the voice input where an explicit target device specification is absent or the target device specification is ambiguous, as described below.

In some implementations, when a voice-activated device 104 receives a voice input with an explicit specification of a target device or device group, the voice-activated device 104 establishes a focus session with respect to the specified target device or device group. In some implementations, the voice-activated device 104 stores, for the focus session, a session start time (e.g., the timestamp of the voice input based on which the focus session was started) and, as the in-focus device for the focus session, the specified target device or device group. In some implementations, the voice-activated device 104 also logs subsequent voice inputs in the focus session. The voice-activated device 104 logs at least the most recent voice input in the focus session and optionally logs and retains preceding voice inputs within the focus session as well. In some implementations, the voice assistance server system 112 establishes the focus session. In some implementations, the focus session may be ended by a voice input explicitly specifying a different target device or device group.

While a focus session with respect to a device is active and the voice-activated device receives a voice input, the voice-activated device 104 makes one or more determinations with respect to the voice input. In some implementations, the determinations include: whether the voice inputs includes an explicit target device specification, whether the request in the voice input is one that can be fulfilled by the in-focus device, and a time of the voice input compared to the time of the last voice input in the focus session and/or the session start time. If the voice input does not include an explicit target device specification, includes a request that can be fulfilled by the in-focus device, and satisfies predefined time criteria with respect to the time of the last voice input in the focus session and/or the session start time, then the in-focus device is assigned as the target device for the voice input. Further details regarding focus sessions are described below.

Devices in the Operating Environment

Figure 2:
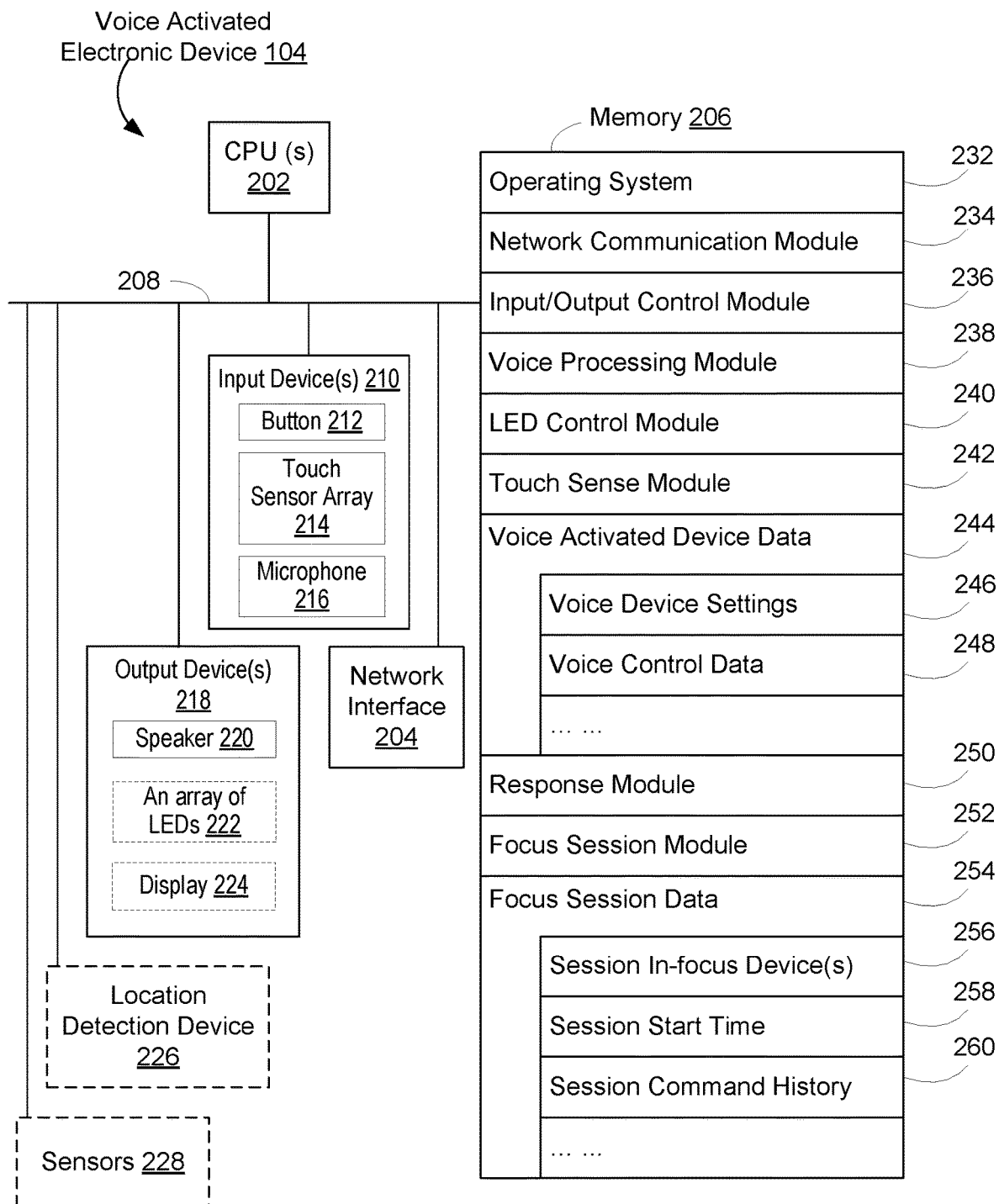
FIG. 2 illustrates an example voice-activated electronic device in accordance with some implementations.

FIG. 2 is a block diagram illustrating an example voice-activated device 104 that is applied as a voice interface to collect user voice commands in an operating environment (e.g., operating environment 100) in accordance with some implementations. The voice-activated device 104, typically, includes one or more processing units (CPUs) 202, one or more network interfaces 204, memory 206, and one or more communication buses 208 for interconnecting these components (sometimes called a chipset). The voice-activated device 104 includes one or more input devices 210 that facilitate user input, such as a button 212, a touch sense array 214, and one or more microphones 216. The voice-activated device 104 also includes one or more output devices 218, including one or more speakers 220, optionally an array of LEDs 222, and optionally a display 224. In some implementations, the array of LEDs 222 is an array of full color LEDs. In some implementations, a voice-activated device 104, depending on the type of device, has either the array of LEDs 222, or the display 224, or both. In some implementations, the voice-activated device 104 also includes a location detection device 226 (e.g., a GPS module) and one or more sensors 228 (e.g., accelerometer, gyroscope, light sensor, etc.).

Memory 206 includes high-speed random access memory, such as DRAM, SRAM, DDR RAM, or other random access solid state memory devices; and, optionally, includes non-volatile memory, such as one or more magnetic disk storage devices, one or more optical disk storage devices, one or more flash memory devices, or one or more other non-volatile solid state storage devices. Memory 206, optionally, includes one or more storage devices remotely located from one or more processing units 202. Memory 206, or alternatively the non-volatile memory within memory 206, includes a non-transitory computer readable storage medium. In some implementations, memory 206, or the non-transitory computer readable storage medium of memory 206, stores the following programs, modules, and data structures, or a subset or superset thereof:

Operating system 232 including procedures for handling various basic system services and for performing hardware dependent tasks;

Network communication module 234 for connecting the voice-activated device 104 to other devices (e.g., the voice assistance service 140, one or more controllable devices 106, one or more client devices 103, and other voice-activated device(s) 104) via one or more network interfaces 204 (wired or wireless) and one or more networks 110, such as the Internet, other wide area networks, local area networks (e.g., local network 108), metropolitan area networks, and so on;

Input/output control module 236 for receiving inputs via one or more input devices and enabling presentation of information at the voice-activated device 104 via one or more output devices 218, including:

Voice processing module 238 for processing audio inputs or voice messages collected in an environment surrounding the voice-activated device 104, or preparing the collected audio inputs or voice messages for processing at a voice assistance server system 112;

LED control module 240 for generating visual patterns on the LEDs 222 according to device states of the voice-activated device 104; and Touch sense module 242 for sensing touch events on a top surface (e.g., on touch sensor array 214) of the voice-activated device 104;

Voice activated device data 244 for storing at least data associated with the voice-activated device 104, including:

Voice device settings 246 for storing information associated with the voice-activated device 104 itself, including common device settings (e.g., service tier, device model, storage capacity, processing capabilities, communication capabilities, etc.), information of one or more user accounts in a user domain, device nicknames and device groups, settings regarding restrictions when dealing with a non-registered user, and display specifications associated with one or more visual patterns displayed by the LEDs 222; and Voice control data 248 for storing audio signals, voice messages, response messages and other data related to voice interface functions of the voice-activated device 104;

Response module 250 for performing instructions included in voice request responses generated by the voice assistance server system 112, and in some implementations, generating responses to certain voice inputs; and Focus session module 252 for establishing, managing, and ending focus sessions with respect to devices.

In some implementations, the voice processing module 238 includes the following modules (not shown):

User identification module for identifying and disambiguating users who provide voice inputs to the voice-activated device 104;

Hotword recognition module for determining whether voice inputs include a hotword for waking up the voice-activated device 104 and recognizing such in the voice inputs; and Request recognition module for determining a user request included in a voice input.

In some implementations, memory 206 also stores focus session data 254 for an outstanding focus session, including the following:

Session in-focus device(s) 256 for storing an identifier of the device or device group in focus in an outstanding focus session (e.g., the device nickname, the device group name, MAC address(es) of the device(s));

Session start time 258 for storing a timestamp for the start of the outstanding focus session; and Session command history 260 for storing a log of prior requests or commands in the focus session, including at least the most recent request/command. The log includes at least the timestamp(s) of the logged prior request(s)/command(s).

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various implementations. In some implementations, memory 206, optionally, stores a subset of the modules and data structures identified above. Furthermore, memory 206, optionally, stores additional modules and data structures not described above. In some implementations, a subset of the programs, modules, and/or data stored in the memory 206 can be stored on and/or executed by the voice assistance server system 112.

In some implementations, one or more of the modules in memory 206 described above are part of a voice processing library of modules. The voice processing library may be implemented and embedded on a wide variety of devices. An example of a voice processing library is described in U.S. Provisional Patent Application No. 62/334,434, entitled "Implementations for Voice Assistant on Devices," filed May 10, 2016, which is incorporated by reference herein in its entirety.

Figure 3:
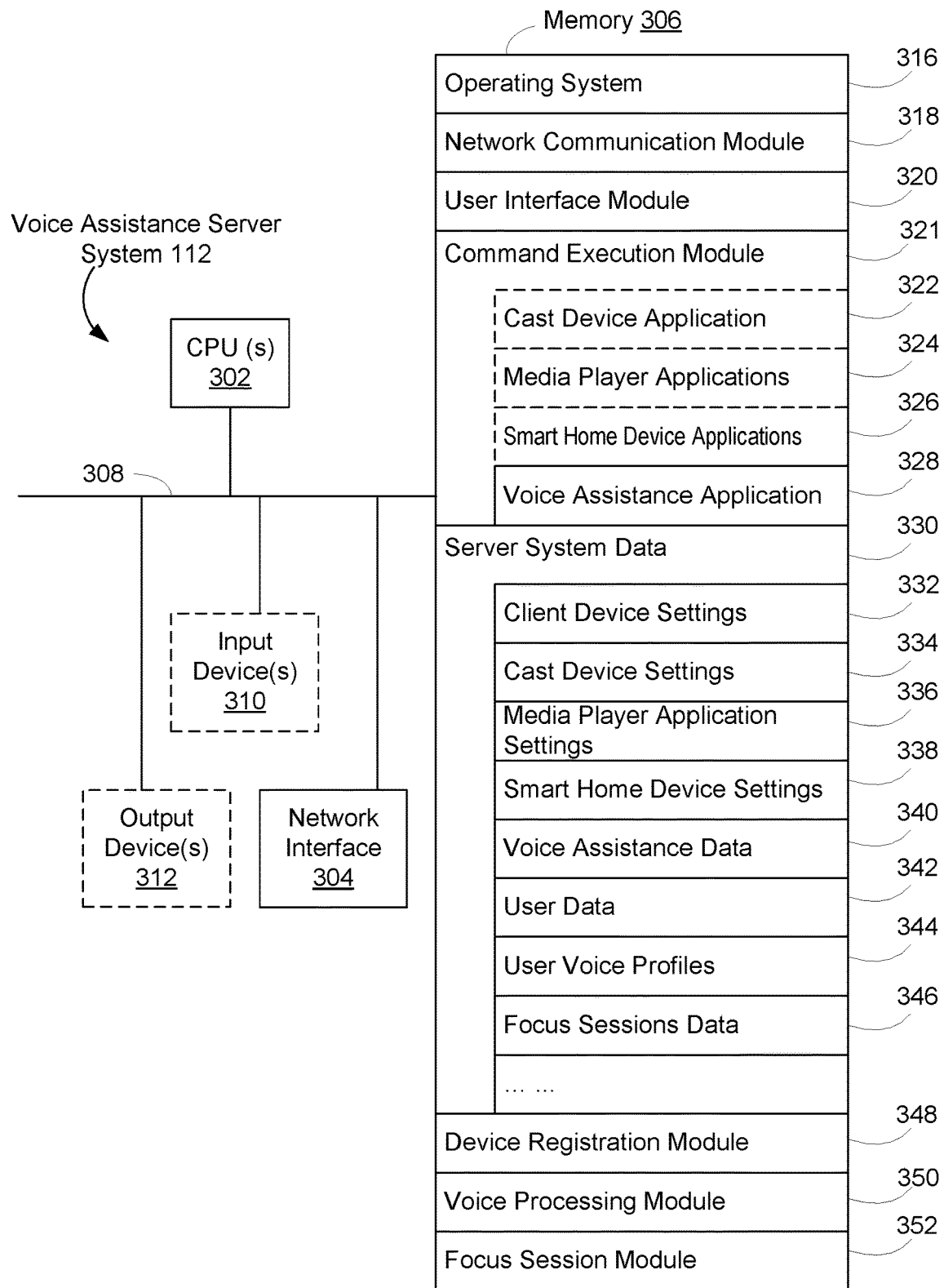
FIG. 3 illustrates an example voice assistance server system in accordance with some implementations.

FIG. 3 is a block diagrams illustrating an example voice assistance server system 112 of a voice assistant service 140 of an operating environment (e.g., operating environment 100) in accordance with some implementations. The server system 112, typically, includes one or more processing units (CPUs) 302, one or more network interfaces 304, memory 306, and one or more communication buses 308 for interconnecting these components (sometimes called a chipset). The server system 112 may include one or more input devices 310 that facilitate user input, such as a keyboard, a mouse, a voice-command input unit or microphone, a touch screen display, a touch-sensitive input pad, a gesture capturing camera, or other input buttons or controls. Furthermore, the server system 112 may use a microphone and voice recognition or a camera and gesture recognition to supplement or replace the keyboard. In some implementations, the server system 112 includes one or more cameras, scanners, or photo sensor units for capturing images, for example, of graphic series codes printed on the electronic devices. The server system 112 may also include one or more output devices 312 that enable presentation of user interfaces and display content, including one or more speakers and/or one or more visual displays.

Memory 306 includes high-speed random access memory, such as DRAM, SRAM, DDR RAM, or other random access solid state memory devices; and, optionally, includes non-volatile memory, such as one or more magnetic disk storage devices, one or more optical disk storage devices, one or more flash memory devices, or one or more other non-volatile solid state storage devices. Memory 306, optionally, includes one or more storage devices remotely located from one or more processing units 302. Memory 306, or alternatively the non-volatile memory within memory 306, includes a non-transitory computer readable storage medium. In some implementations, memory 306, or the non-transitory computer readable storage medium of memory 306, stores the following programs, modules, and data structures, or a subset or superset thereof:
Operating system 316 including procedures for handling various basic system services and for performing hardware dependent tasks;
Network communication module 318 for connecting the server system 112 to other devices (e.g., client devices 103, controllable devices 106, voice-activated devices 104) via one or more network interfaces 304 (wired or wireless) and one or more networks 110, such as the Internet, other wide area networks, local area networks, metropolitan area networks, and so on;
User interface module 320 for enabling presentation of information (e.g., a graphical user interface for presenting application(s) 322-328, widgets, websites and web pages thereof, and/or games, audio and/or video content, text, etc.) at a client device;
Command execution module 321 for execution on the server side (e.g., games, social network applications, smart home applications, and/or other web or non-web based applications for controlling a client device 103, a controllable device 106, a voice-activated device 104 and a smart home devices and reviewing data captured by such devices), including one or more of:
a cast device application 322 that is executed to provide server-side functionalities for device provisioning, device control, and user account management associated with cast device(s);
one or more media player applications 324 that is executed to provide server-side functionalities for media display and user account management associated with corresponding media sources;
one or more smart home device applications 326 that is executed to provide server-side functionalities for device provisioning, device control, data processing and data review of corresponding smart home devices; and
a voice assistance application 328 that is executed to arrange voice processing of a voice message received from the voice-activated device 104 or directly process the voice message to extract a user voice command and one or more parameters for the user voice command (e.g., a designation of a cast device or another voice-activated device 104); and
Server system data 330 storing at least data associated with automatic control of media display (e.g., in an automatic media output mode and a follow-up mode) and other data, including one or more of:
Client device settings 332 for storing information associated with one or more client device, including common device settings (e.g., service tier, device model, storage capacity, processing capabilities, communication capabilities, etc.), and information for automatic media display control;
Cast device settings 334 for storing information associated with user accounts of the cast device application 322, including one or more of account access information, information for device settings (e.g., service tier, device model, storage capacity, processing capabilities, communication capabilities, etc.), and information for automatic media display control;
Media player application settings 336 for storing information associated with user accounts of one or more media player applications 324, including one or more of account access information, user preferences of media content types, review history data, and information for automatic media display control;
Smart home device settings 338 for storing information associated with user accounts of the smart home applications 326, including one or more of account access information, information for one or more smart home devices (e.g., service tier, device model, storage capacity, processing capabilities, communication capabilities, etc.);
Voice assistance data 340 for storing information associated with user accounts of the voice assistance application 328, including one or more of account access information, information for one or more voice-activated devices 104 (e.g., service tier, device model, storage capacity, processing capabilities, communication capabilities, etc.);
User data 342 for storing information associated with users in the user domain, including users' subscriptions (e.g., music streaming service subscriptions, video streaming service subscriptions, newsletter subscriptions), user devices (e.g., devices registered in the device registry 118 associated with respective users, device nicknames, device groups), user accounts (e.g., users' email accounts, calendar accounts, financial accounts), and other user data;

User voice profiles 344 for storing voice profiles of the users in the user domain, including, for example, voice models or voice fingerprints of the users and comfortable volume level thresholds of the users; and Focus sessions data 346 for storing focus sessions data for multiple devices.

Device registration module 348 for managing the device registry 118;

Voice processing module 350 for processing audio inputs or voice messages collected in an environment surrounding the electronic device 104; and Focus session module 352 for establishing, managing, and ending focus sessions with respect to devices.

In some implementations, memory 306 also stores focus session data 346 for one or more outstanding focus sessions 3462-1 thru 3462-M, including the following:

Session source device 3464 for storing an identifier of the device at which a focus session is established;

Session in-focus device(s) 3466 for storing an identifier of the device or device group in focus in an outstanding focus session (e.g., the device nickname, the device group name, MAC address(es) of the device(s));

Session start time 3468 for storing a timestamp for the start of the outstanding focus session; and Session command history 3470 for storing a log of prior requests or commands in the focus session, including at least the most recent request/command.

In some implementations, the voice assistance server system 112 is primarily responsible for processing of voice inputs, and thus one or more of the programs, modules, and data structures in memory 206 described above with reference to FIG. 2 are included in respective modules in memory 306 (e.g., the programs, modules, and data structures included with voice processing module 238 are included in voice processing module 350). The voice-activated device 104 either transmits captured voice inputs to the voice assistance server system 112 for processing, or first pre-processes the voice inputs and transmits the pre-processed voice inputs to the voice assistance server system 112 for processing. In some implementations, the voice assistance server system 112 and the voice-activated device 104 has some shared and some divided responsibilities regarding processing of voice inputs, and the programs, modules, and data structures shown in FIG. 2 may be included in both or divided amongst the voice assistance server system 112 and the voice-activated device 104. Other programs, modules, and data structures shown in FIG. 2, or analogues thereof, may also be included in the voice assistance server system 112.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various implementations. In some implementations, memory 306, optionally, stores a subset of the modules and data structures identified above. Furthermore, memory 306, optionally, stores additional modules and data structures not described above.

Figure 4B:
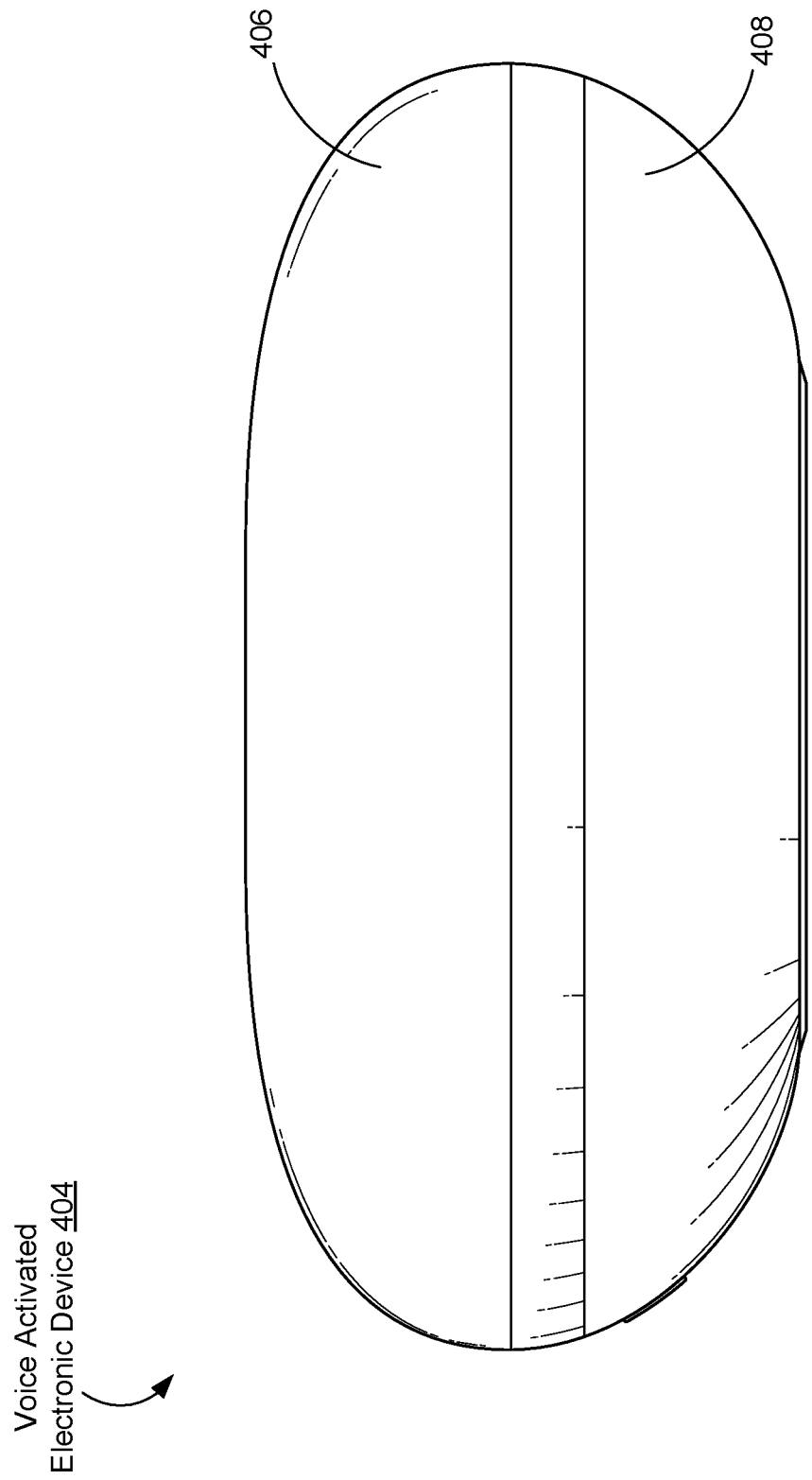
Figure 4C:
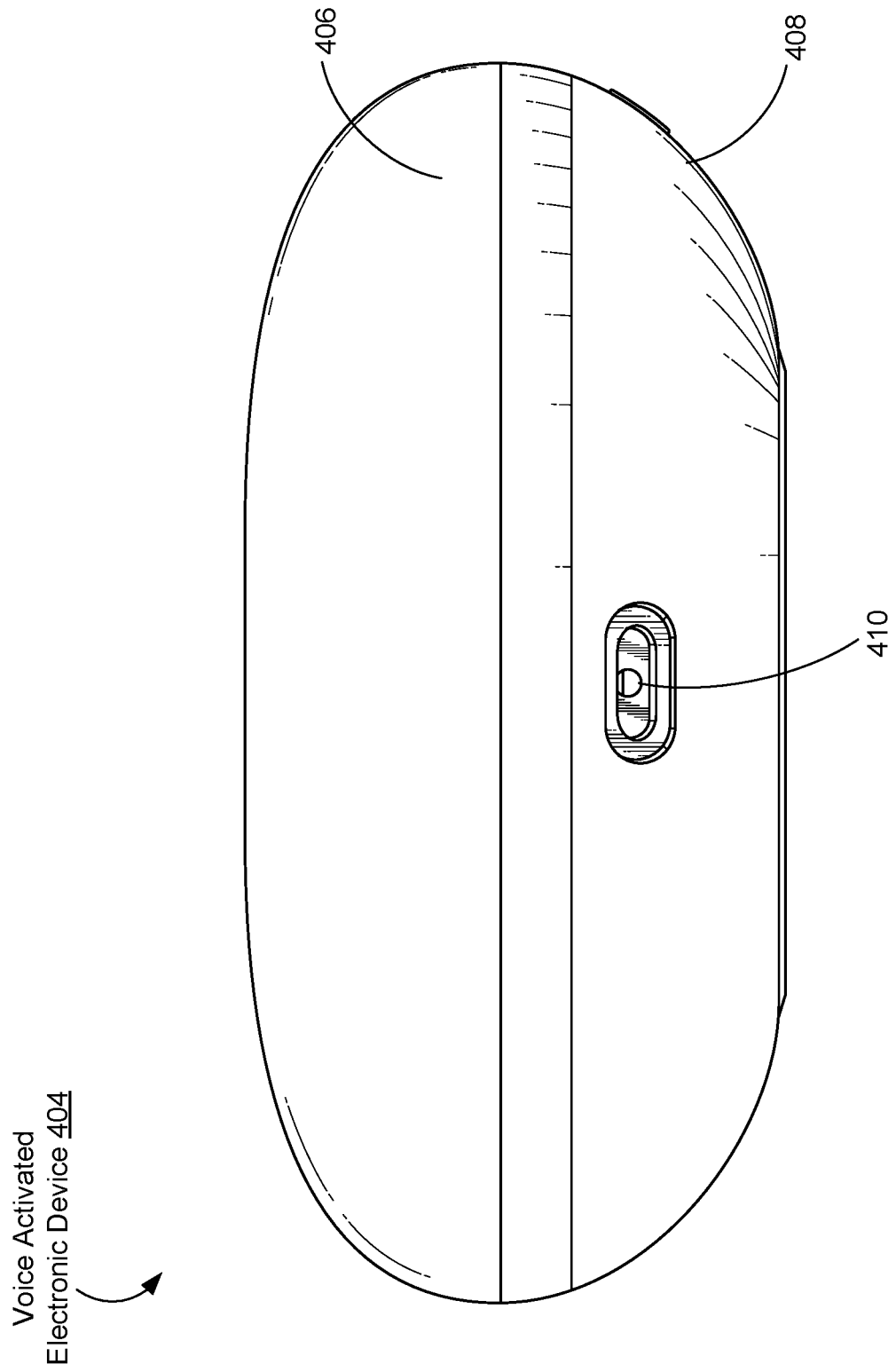

Design for Compact Home Assistant with Combined Acoustic Waveguide and Heat Sink FIGS. 4A, 4B and 4C are a front view, side view and rear view, respectively of an example compact voice-activated electronic device 404 in accordance with some implementations. The electronic device 404 includes an overall exterior including an upper portion 406 and a base portion 408, and electronic components and one or more speakers contained within the overall exterior. The electronic device 404 is compact and fits naturally in many areas of a home. The electronic device 404 includes one or more microphones 216 and optionally includes an array of full color LEDs (not shown). The full color LEDs (e.g., LEDs 222 in FIG. 2) could be hidden under a top surface of the electronic device 404 and invisible to the user when they are not lit. The rear side of the electronic device 404 optionally includes a power supply connector 410 configured to couple to a power supply and the front side optionally includes a power switch 412.

In some implementations, the electronic device 404 presents a clean look having no visible button, and the interaction with the electronic device 404 is based on voice and touch gestures. Alternatively, in some implementations, the electronic device 404 includes a limited number of physical buttons, and the interaction with the electronic device 404 is further based on a press on the button in addition to the voice and touch gestures.

Figure 4D:
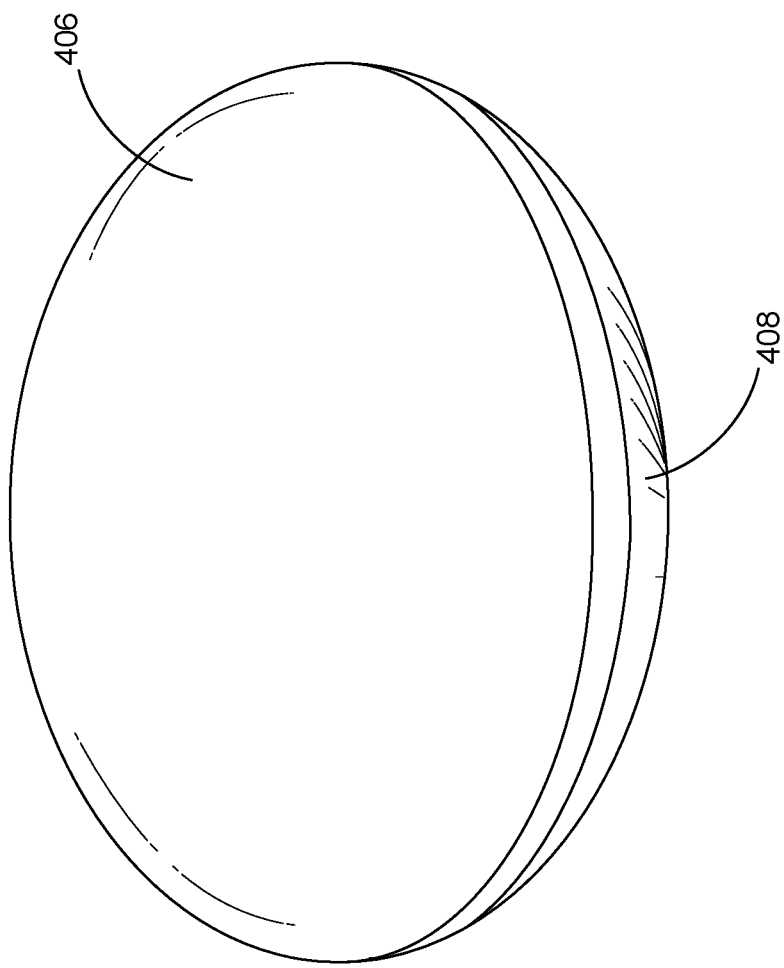
FIG. 4D is a perspective view of an example voice-activated electronic device in accordance with some implementations.

FIG. 4D is a perspective view of the voice-activated electronic device 404. One or more speakers (not shown) are disposed and concealed in the electronic device 404 and project sound through a porous wall of the device exterior to allow sound waves generated from the speaker to penetrate to the outside of the device.

Figure 4E:
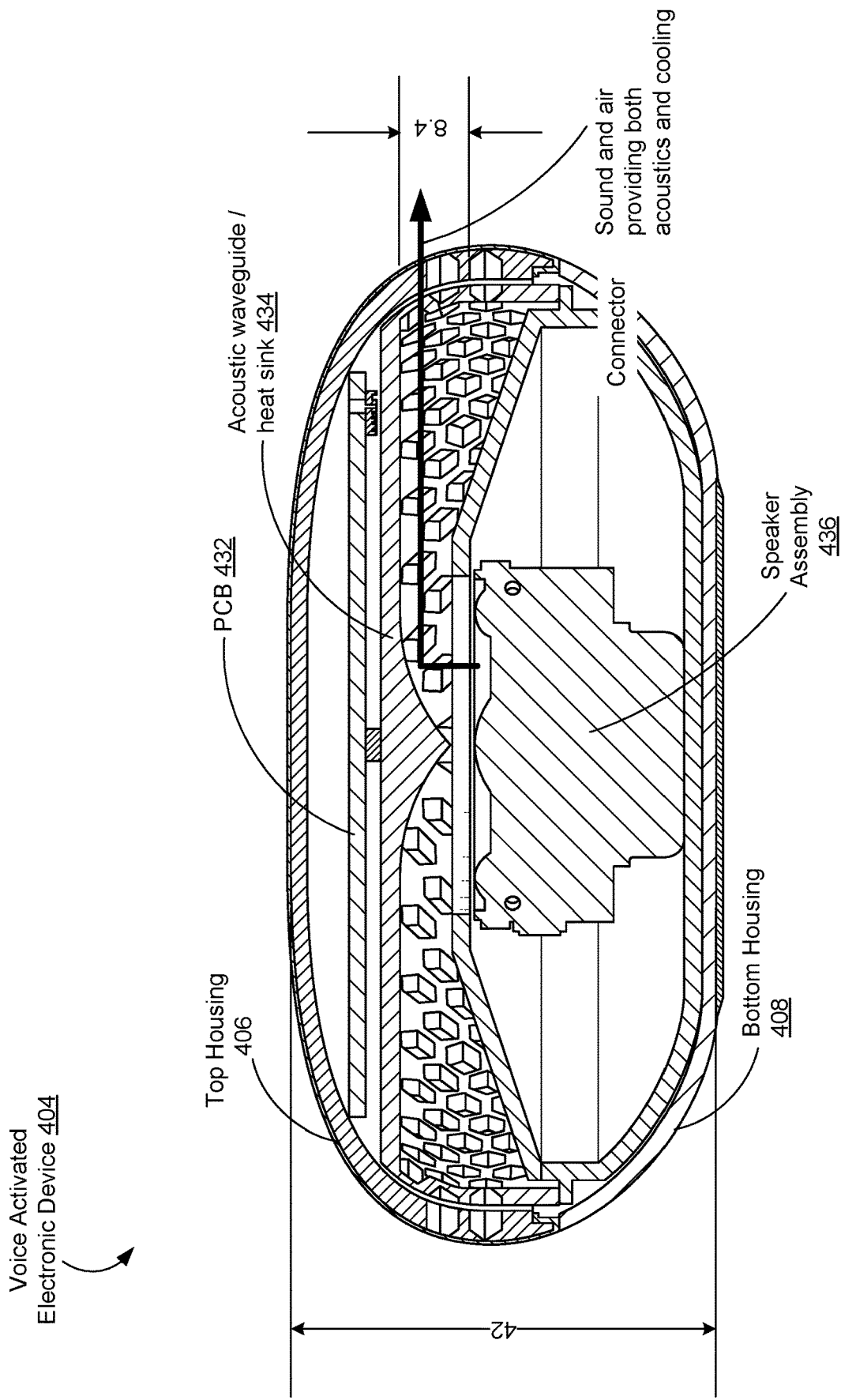
FIG. 4E is a cutaway view of an example voice-activated electronic device showing a dual purpose waveguide/heatsink in accordance with some implementations.

FIG. 4E is a cutaway view of an example voice-activated electronic device 404 showing a dual purpose waveguide/heatsink in accordance with some implementations. In some implementations, the electronic device 404 is a compact device that includes one or more speakers 436 and a plurality of electronic components, including one or more of: microprocessors, memory, support chips, wireless receivers and transmitters, antennas, power supply circuitry, one or more cameras, power and/or data connectors, etc., some of which are mounted on one or more printed circuit boards 432. The speakers ("speaker assembly") 436 can be employed for any audio output purpose, including output of audible responses to user verbal inputs, playback of audio tracks of media content, and generation of audible alerts (including beeps, alarms, sirens, etc). In some implementations, the one or more speakers 436 are mounted within the electronic device 404 such that there is no direct path for transmission to the outside of the device of sound generated by the one or more speakers 436. In such implementations, in order to promote effective speaker operation (including effective transmission of sound output by the speaker 436 to the outside of the device), an acoustic waveguide 434 is provided within the electronic device 404 to redirect sound output by the one or more speakers 436 from the inside to the outside of the device.

In some implementations, the electronic device includes an upper portion 406 that serves as a speaker grill that allows transmission of sound outside the device from one or more speakers 436 contained within the electronic device 404. In some implementations, the upper portion/speaker grill 406 can be configured with different surface finishes and/or can be securely but separably fastened to the base portion as described in provisional patent application 62/403,681, entitled "VOICE-ACTIVATED ELECTRONIC DEVICE ASSEMBLY WITH SEPARABLE BASE," the contents of which are incorporated herein by reference in their entirety. In some implementations, the waveguide 434 is configured to redirect the sound to a speaker grill provided at an outer surface of the electronic device.

In some implementations, the acoustic waveguide 434 is also configured to serve as a heatsink to dissipate to the outside of the electronic device heat generated by operation of the electronic components and is mounted in proximity to least some of the electronic components (e.g., components mounted on the PCB 432, or printed circuit board 432).

In some implementations, the one more speakers 436 are mounted in a base portion 408 (e.g., "bottom housing") of the electronic device 404 and have a primary sound projection direction that faces upwards within the device, towards a curved portion of the dual purpose waveguide/heatsink 434. The curved portion is designed to redirect sound from the one or more speakers 436 to the outside of the electronic device 404. Heat generating electronic components and/or one or more printed circuit boards 432 carrying electronic components are attached directly to a second portion of the dual purpose waveguide/heatsink 434 (or are coupled indirectly thereto using a thermal conduction path) so as to transmit to the heatsink heat generated by operation of the electronic components. The heatsink 434 is configured to move to the outside of the electronic device heat transmitted thereto from the attached electronic components. In some implementations, the heatsink 434 is made from materials that have highly effective thermal conduction properties to promote movement of heat from within the device to the outside of the device. In some implementations, the curved portion is a bottom surface of the dual purpose waveguide/heatsink 434 (e.g., a surface facing downwards towards the one or more speakers 436) and the second portion is an upper surface of the dual purpose waveguide/heatsink 434 that is opposite the bottom surface of the dual purpose waveguide/heatsink 434 (e.g., a surface facing upwards to which the electronic components are attached). Other shapes and forms of the upper and lower portions of the waveguide/heatsink 434 can be employed as would be apparent to one skilled in the art.

In some implementations, positions of the electronic components and the one more speakers 436 are interchanged such that the one more speakers 436 are located in an upper portion 406 of the electronic device 404 and project downwards towards an upper (curved) surface of the dual purpose waveguide/heatsink and the electronic components are mounted in a base portion 408 of the electronic device 404 and waveguide/heatsink 434 is mounted in the lower portion (e.g., "bottom housing").

In some implementations, the acoustic waveguide design channels sound from speaker 436 to desired output ports and thermally attached to the PCB 432 allowing the waveguide 434 to also function as heatsink/spreader. Wrapping the waveguide/heat sink 434 on the interior of the housing allows for larger thermal mass and greater surface for thermal radiation. In some implementations, a cutout pattern on a wrapped portion of the waveguide enhances thermal efficiency and allows sound to transmit out. In some implementations, during speaker function, sound waves also drives air over waveguide/heat sink 434 thus further enhancing thermal performance at time of greatest thermal generation.

In some implementations, as shown in FIG. 4E, the cone of the waveguide/heat sink redirects the sound from the up pointing speaker 436 to the side. Since the PCB 432 is directly on top of the waveguide 434, it is also used as a heat sink. A wave guide 434 can be of any material but a heat sink should be a highly thermally conductive material. In some implementations, the waveguide material is a metal, (e.g., aluminum or copper), but the waveguide/heat sink 434 can also be fashioned from materials other than metal.

Figure 4F:
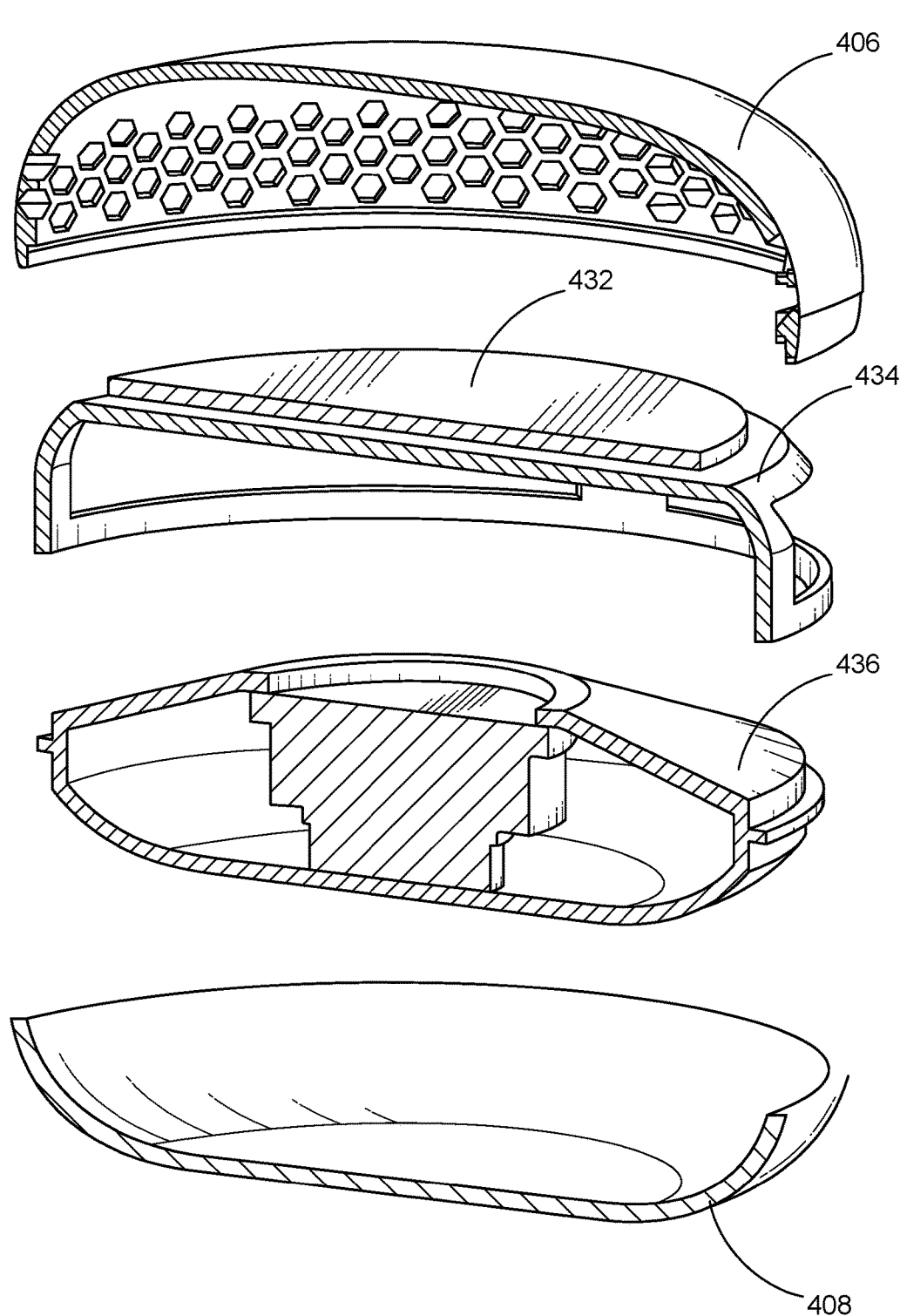
FIG. 4F is an exploded view of an example voice-activated electronic device in accordance with some implementations.

FIG. 4F is an exploded view of an example voice-activated electronic device in accordance with some implementations. This shows a perforated upper portion 406 to allow transmission of sound waves, PCB 432, acoustic waveguide/heatsink 434, bottom portion of waveguide and speaker assembly 436 and base portion 408.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

It is to be appreciated that "smart media environments" may refer to smart environments for homes such as a single-family house, but the scope of the present teachings is not so limited. The present teachings are also applicable, without limitation, to duplexes, townhomes, multi-unit apartment buildings, hotels, retail stores, office buildings, industrial buildings, and more generally any living space or work space.

It is also to be appreciated that while the terms user, customer, installer, homeowner, occupant, guest, tenant, landlord, repair person, and the like may be used to refer to the person or persons acting in the context of some particularly situations described herein, these references do not limit the scope of the present teachings with respect to the person or persons who are performing such actions. Thus, for example, the terms user, customer, purchaser, installer, subscriber, and homeowner may often refer to the same person in the case of a single-family residential dwelling, because the head of the household is often the person who makes the purchasing decision, buys the unit, and installs and configures the unit, and is also one of the users of the unit. However, in other scenarios, such as a landlord-tenant environment, the customer may be the landlord with respect to purchasing the unit, the installer may be a local apartment supervisor, a first user may be the tenant, and a second user may again be the landlord with respect to remote control functionality. Importantly, while the identity of the person performing the action may be germane to a particular advantage provided by one or more of the implementations, such identity should not be construed in the descriptions that follow as necessarily limiting the scope of the present teachings to those particular individuals having those particular identities.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A speaker device, comprising:
   a rounded enclosure including a first housing element and a second housing element configured to couple to the first housing element, wherein transition between the first and second housing elements is substantially continuous;
   a speaker unit arranged within the rounded enclosure such that a primary sound projection path from the speaker unit is towards the first housing element; and
   a circuit board arranged within the rounded enclosure and electrically coupled to the speaker unit, the circuit board including:
      one or more electronic components configured to drive the speaker unit;
      power supply circuitry; and
      a wireless transceiver configured to receive and transmit signals;
   wherein:
      the first housing element includes a perforated portion having perforations configured to enable transmission of sound out of the speaker device;
      the second housing element includes a power connector that is electrically coupled to the circuit board and is configured to receive power from an external power supply; and
      the rounded enclosure of the speaker device has a maximum cross section defined by a first size, wherein the perforated portion of the first housing element wraps around the maximum cross section along a smooth and rounded contour intersecting the maximum cross section for transmitting outside the speaker device sound generated by the speaker unit via the perforated portion of the first housing element, and the second housing element has an upper opening having a second size that is smaller than the first size.

2. The speaker device of claim 1, wherein the first housing element has a first external surface covering and the second housing element has a second external surface covering different from the first external surface covering, wherein the first external surface covering is substantially acoustically transparent.

3. The speaker device of claim 2, wherein the perforations of the first housing element are covered by the first external surface covering, and the second housing element does not include any perforations to allow sound to transmit out of the speaker device.

4. The speaker device of claim 1, wherein the overall enclosure of the speaker device is radially symmetric about an axis through the centers of the first and second housing elements.

5. The speaker device of claim 4, wherein at least a portion of the second housing element is flattened to enable the speaker device to sit securely on a flat surface.

6. The speaker device of claim 1, wherein the upper opening of the second housing element enables access to the power connector.

7. The speaker device of claim 6, wherein the upper opening is positioned close to intersection between the first and second housing elements.

8. The speaker device of claim 1, further comprising a sound transmission element positioned between a speaker opening of the speaker unit and the first housing element so as to direct sound propagation from the speaker unit.

9. The speaker device of claim 1, wherein the second housing element includes a power switch.

10. The speaker device of claim 9, wherein the power switch is positioned close to intersection between the first and second housing elements.

11. An electronic device, comprising:
    a rounded enclosure including a first housing element and a second housing element configured to couple to the first housing element, wherein transition between the first and second housing elements is substantially continuous;
    a speaker unit arranged within the rounded enclosure such that a primary sound projection path from the speaker unit is towards the first housing element; and
    a circuit board arranged within the rounded enclosure and electrically coupled to the speaker unit, the circuit board including:
       one or more electronic components configured to drive the speaker unit;
       power supply circuitry; and
       a wireless transceiver configured to receive and transmit signals;
    wherein:
       the first housing element includes a perforated portion having perforations configured to enable transmission of sound out of the speaker device;
       the second housing element includes a power connector that is electrically coupled to the circuit board and is configured to receive power from an external power supply; and
       the rounded enclosure of the speaker device has a maximum cross section defined by a first size, wherein the perforated portion of the first housing element wraps around the maximum cross section along a smooth and rounded contour intersecting the maximum cross section for transmitting outside the speaker device sound generated by the speaker unit via the perforated portion of the first housing element, and the second housing element has an upper opening having a second size that is smaller than the first size.

12. The electronic device of claim 11, wherein the electronic device is configured to communicate with a client device via a short range communication link.

13. The electronic device of claim 12, wherein the short range communication link is established based on Bluetooth.

14. The electronic device of claim 11, wherein a diameter of the maximum cross section of the electronic device is greater than a height of the electronic device.

15. The electronic device of claim 11, further comprising a physical button, wherein interaction with the electronic device is based on a press on the physical button.

16. An electronic system, comprising:
a rounded enclosure including a first housing element and a second housing element configured to couple to the first housing element, wherein transition between the first and second housing elements is substantially continuous;
a speaker unit arranged within the rounded enclosure such that a primary sound projection path from the speaker unit is towards the first housing element; and
a circuit board arranged within the rounded enclosure and electrically coupled to the speaker unit, the circuit board including:
one or more electronic components configured to drive the speaker unit;
power supply circuitry; and
a wireless transceiver configured to receive and transmit signals;
wherein:
the first housing element includes a perforated portion having perforations configured to enable transmission of sound out of the speaker device;
the second housing element includes a power connector that is electrically coupled to the circuit board and is configured to receive power from an external power supply; and
the rounded enclosure of the speaker device has a maximum cross section defined by a first size, wherein the perforated portion of the first housing element wraps around the maximum cross section along a smooth and rounded contour intersecting the maximum cross section for transmitting outside the speaker device sound generated by the speaker unit via the perforated portion of the first housing element, and the second housing element has an upper opening having a second size that is smaller than the first size.

17. The electronic system of claim 16, wherein the electronic system has a microphone, and is controlled based on voice or touch.

18. The electronic system of claim 16, wherein the electronic system is configured to output audible responses to user verbal inputs, play back audio tracks of media content, and/or generate audible alerts.

19. The electronic system of claim 16, further comprising a visual indicator configured to indicate a status of the electronic system.

20. The electronic system of claim 19, wherein the visual indicator includes an LED.

* * * * *